United States Patent
Karkkainen et al.

(10) Patent No.: US 8,922,098 B2
(45) Date of Patent: Dec. 30, 2014

(54) METHOD AND DEVICE FOR ENERGY HARVESTING

(75) Inventors: Anna-Maija Karkkainen, Helsinki (FI); Jukka Kyynarainen, Espoo (FI); Leif Roschier, Vantaa (FI); Heikki Kuisma, Helsinki (FI)

(73) Assignees: VTI Technologies Oy, Vantaa (FI); Toyota Motor Corporation, Toyota-Shi (JP)

( * ) Notice: Subject to any disclaimer, the term of this patent is extended or adjusted under 35 U.S.C. 154(b) by 212 days.

(21) Appl. No.: 13/501,001

(22) PCT Filed: Oct. 8, 2010

(86) PCT No.: PCT/FI2010/050785
§ 371 (c)(1),
(2), (4) Date: Apr. 9, 2012

(87) PCT Pub. No.: WO2011/042611
PCT Pub. Date: Apr. 14, 2011

(65) Prior Publication Data
US 2012/0206017 A1    Aug. 16, 2012

(30) Foreign Application Priority Data

Oct. 8, 2009    (FI) ..................................... 20096034

(51) Int. Cl.
*H02N 2/18* (2006.01)
*B60C 23/04* (2006.01)

(52) U.S. Cl.
CPC ............ *H02N 2/186* (2013.01); *B60C 23/0411* (2013.01)
USPC .......................................... 310/339; 310/311

(58) Field of Classification Search
CPC .................................. H02N 2/18; H02N 2/186
USPC .......................... 310/339, 319, 311, 338, 312
See application file for complete search history.

(56) References Cited

U.S. PATENT DOCUMENTS 5,801,475 A * 9/1998 Kimura ........................ 310/319
(Continued)

FOREIGN PATENT DOCUMENTS

WO    2006114741 A2    11/2006
(Continued)

OTHER PUBLICATIONS

Khbeis, M. et al.: "Development of a Simplified Hybrid Ambient Low 1-2,4-8,10-17, Frequency, Low Intensity Vibration Energy Scavenger System", in: Proc. of IEEE International Conference on Solid-State Sensors, Actuators and Microsystems—Transducers 2009, 21.—25.6.2009, ISBN, 978-1-4244-4190-7, p. 525-528. doi:10.11 09/SENSOR. 2009.5285377, abstract, p. 526 first paragraph in the left column, p. 528 final paragraph in the left column, figures 1 and 2, Cited in Finnish Search Report and ISR.

(Continued)

*Primary Examiner* — Thomas Dougherty
*Assistant Examiner* — Karen B Addison
(74) *Attorney, Agent, or Firm* — Young & Thompson

(57) ABSTRACT

A device (100) harvests energy from vibration and/or strain and utilizes both capacitive (102a, 102b) and piezoelectric elements (105). The principle of operation is out-of-plane capacitive harvester, where the bias voltage for the capacitive element is generated with a piezoelectric element (105). The device utilizes a thin dielectric film (104) between the capacitor plates (102a, 102b) maximizing the harvested energy and enabling the harvester operation in semi-contact mode so that short circuits are prevented. For example when utilized in a wheel or the like, the capacitor is closed and opened at every strike or every turn of a wheel being thus independent of the harvester's mechanical resonance frequency.

17 Claims, 2 Drawing Sheets

(56) References Cited

U.S. PATENT DOCUMENTS

| | | | |
|---|---|---|---|
| 6,407,484 B1 * | 6/2002 | Oliver et al. | 310/339 |
| 6,479,920 B1 * | 11/2002 | Lal et al. | 310/309 |
| 7,965,016 B2 * | 6/2011 | Despesse et al. | 310/319 |
| 2003/0094663 A1 * | 5/2003 | Sato et al. | 257/414 |
| 2007/0125176 A1 | 6/2007 | Liu | |
| 2008/0129147 A1 | 6/2008 | Thiesen et al. | |
| 2008/0136292 A1 | 6/2008 | Thiesen | |

FOREIGN PATENT DOCUMENTS

| | | | |
|---|---|---|---|
| WO | 2007/044443 A2 | 4/2007 | |
| WO | 2007/082894 A1 | 7/2007 | |
| WO | 2007/121092 A1 | 10/2007 | |

OTHER PUBLICATIONS

Scott Meninger et al.: "Vibration-to-Electric Energy Conversion, IEEE Transactions on Very Large Scale Integration (VLSI) Systems", vol. 9, No, 1, Feb. 2001, Cited in Finnish Search Report.

M. Khbeis et al.: "Design of a Hybrid Ambient Low Frequency, Low Intensity Vibration Energy Scavenger", The Sixth International Workshop on Micro and Nanotechnology for Power Generation and Energy Conversion Applications, Nov. 29-Dec. 1, 2006, Berkeley, U.S.A., MEMS Sensors and Actuators Laboratory (MSAL), Department of Electrical and Computer Engineering, Institute for Systems Research, University of Maryland, College Park, MD 20742, U.S.A. Cited in Finnish Search Report.

International Search Report, dated Feb. 17, 2011, from corresponding PCT application.

Finnish Search Report, Jun. 21, 2010, from corresponding Finnish Search Report.

* cited by examiner

METHOD AND DEVICE FOR ENERGY HARVESTING

TECHNICAL FIELD OF THE INVENTION

The invention relates to a device and method for energy harvesting from vibration, strain, turn and/or strike.

BACKGROUND OF THE INVENTION

Over the past few decades, the need of powering e.g. wireless sensors has initiated the research activity on energy harvesting from the environment. The wireless communication capabilities cannot be fully utilized if energy is supplied by wires, or if there is a battery with limited operation time, bulky size, and large weight.

The energy harvesting mechanism depends on the environment and the application. Various energy sources have been proposed: light, heat (thermal gradient), strain, vibrations, electromagnetic field, kinetics, air flow, pressure variations, and radioactive materials, as well as also vibration.

One of most studied application for energy harvesting is e.g. car tyre pressure monitoring systems TPMS. There are already battery operated devices on the market, but harvesters would increase the operation time of these systems. The power level needed for TPMS is currently in the range of 100 μW. This is at least ten times more than reported by the typical state-of-the-art devices published. However, the power levels required by the applications are constantly decreasing while the harvested power levels are increasing. It seems likely that one day these levels will meet.

There are known some prior art energy harvesting devices, such as for example US 2007/0125176 A1 discloses an energy harvesting device having a micro-electromechanical structure fabricated as a plurality of members respectively resonant at different frequencies so that the structure can respond to a number of different vibration frequencies. Piezoelectric material converts the vibrations into an electric voltage difference across at least a portion of the structure.

In addition WO 2007044443 discloses a solution of powering an electronic device in a tire monitoring system using a tire pressure based energy scavenger, where pressure changes caused by the rotation of the tire are converted into electrical energy with a transducer having a casing which surface is coated with a conductive layer (1112), and an ultra-thin (approximately 100 nm) dielectric film (1114) to ensure that the conductive diaphragm never actually makes electrical contact with the conductive layer on the rigid casing.

WO 2007044443 also teaches a variable capacitor transducer as a pressure-based energy scavenger, where a rigid casing (1110) is used to create an air-gap variable capacitor between elastomer diaphragm (1120) and rigid casing (1110), and where the variable capacitor is not created by the dimensional change of the diaphragm, but by the changing gap between the diaphragm and the rigid casing. The surface of the diaphragm needs to be conductive.

Furthermore WO 2007121092 A1 discloses a piezoelectric power generator capable of harvesting energy from environmental vibration. The generator includes a dielectric frame supporting a piezoelectric panel having an upper electrode and a piezoelectric layer formed over a lower electrode and a dielectric layer and an end mass formed on the piezoelectric layer. The end mass provides weight to cause the piezoelectric panel to move (vibrate) within the frame and causes the generation of electrical power. The generator is preferably formed by a MEMS process.

However, some disadvantages relate to the known prior art solutions. For example most of the energy harvesters function efficiently only for a certain resonance frequency. In addition devices designed to responding to a number of different vibration frequencies typically consist of a plurality of members respectively resonant at different frequencies. However, the devices with plurality of members become quite complex to manufacture. In addition capacitive based energy harvesters need a battery for a bias voltage in order to start operating properly. Also many of the known harvesters are vulnerable to vibration exceeding the limits of the intended use.

SUMMARY OF THE INVENTION

An object of the invention is to overcome or at least alleviate drawbacks related to the known prior art solutions, such as to maximize harvested energy without limiting a harvester mechanical resonance frequency for a certain frequencies. In addition the invention aims to allow an easy manufacturing process of the energy harvester.

According to an embodiment of the invention two capacitor plates are arranged essentially parallel with each other in a harvesting module of the harvesting device so that a gap is formed between the plates. The first plate is adapted to move due to vibration, strain, turns and/or strike in an essentially perpendicular direction (back and forth motion) to the second capacitor plate, whereupon the volume of the gap is alternately decreased and increased, advantageously minimized and maximized continuously during the vibrations, strains, turns and/or strikes of the device. The back and forth motion thus changes the capacitance between the plates and electrical power is generated to a power output. The principle of operation is out-of-plane capacitive harvester, since the plate motion is in essentially perpendicular direction towards the capacitor plates.

In addition a thin dielectric film is used between the capacitor plates to maximize the harvested energy (and enable the harvester operation in a semi-contact mode). Furthermore a piezoelectric element is used according to the invention in connection with the harvesting device to generate a bias voltage to the capacitor harvesting module from vibration and/or strain in order to enable functioning of the capacitor harvesting module. The capacitor harvesting module needs a bias voltage in order to get started from the rest position.

According to an embodiment the piezoelectric element is used also to generate electrical power to the power output from vibration and/or strain in addition to generating the bias voltage. This enhances the efficiency of the harvesting device since the output power is generated both the capacitive and piezoelectric features.

According to an embodiment of the invention a spring element is connected to the capacitor plate. The spring element is used to enable the plate to oscillate back and forth in relation to the other capacitor plate. For example when a strike deflects the plate from the equilibrium, the spring advantageously returns the plate back making thus an alternating motion. The spring constant is advantageously selected so that the maximum amplitude of the resonating plate is achieved and that the gap is minimized and maximized during the vibrations, strains, turns and/or strikes of the device.

According to a further embodiment of the invention the device is provided with a mass element. The mass element is connected to the capacitor plate so that the mass element enables said plate to oscillate back and forth more efficiently in relation to said other capacitor plate due to mass inertia. The mass is advantageously selected so that the maximum amplitude of the resonating plate is achieved and that the gap is minimized and maximized during the vibrations, strains, turns and/or strikes of the device. Generally the mass is selected as weighty as possible, since more weighty the mass is the more energy is harvested. This is because the greater the mass the greater also the kinetic energy and thus also greater the energy harvested from the motion. It should be noticed that the mass element can be used either alone or in addition to the spring element discussed earlier in this document.

In addition according to an embodiment of the invention the capacitor plates are moved in relation with each other into a semi-contact mode. In other words the plates are as close to each other than possible when the gap is minimized and separated essentially only by the thin dielectric film. The dielectric film or bumps act as a mechanical stopper, and thereby protects the capacitor plates against wear and short circuits, and the harvester structure from breaking under vibration exceeding the limits of the intended use. A high dielectric constant of the film maximizes the capacitance difference at open and closed positions with modest spring displacement amplitudes. The dielectric film may comprise for example silicon oxide, aluminium oxide or DLC (diamond like carbon). The film thickness is according to an embodiment advantageously 25 nm at maximum. It is preferable that the spring and mass are designed such that the electrodes touch each other via the dielectric film at a certain alignment/position of the harvester, possibly in a stationary state of the harvester, and at least in its normal use. For example, if the harvester is rotating in its normal use, the harvester is arranged to reach such a position during every rotation. Thus the electrodes touch via the film on every turn, and a high/maximal capacitance is achieved at this loading period of the harvester. At the work period, when the electrodes recede apart each other, high/maximum energy is thus obtained. In vibrating use, for example, the loading period and the work period are repeated in a corresponding manner during the vibration cycle, whereby the electrodes touch each other at the loading period of the vibration. During the loading period, the bias voltage is preferably applied to the electrodes.

The invention can be applied in oscillating, vibrating, reciprocating, turning and/or striking systems, such as a wheel or tire, or any other vibrating machines and devices, like equipments and pipelines in processing industry.

Capacitive energy harvester of the invention can be manufactured e.g. using Micro System Technology (MST) and hence it can be integrated with the electronics. This invention enables small, integrated, and affordable energy harvester for low power applications.

The invention offers clear advantages over the known prior art solutions, such as maximized harvested energy due to e.g. the semi-contact mode and maximizing the capacitance change by using thin dielectric film. In addition no additional battery is needed for enabling the functioning of the capacitor harvester, since the piezoelectric film is used to generate the bias voltage for the capacitor harvester. Furthermore the harvester according to the invention is independent of the component's mechanical resonance frequency, since the gap between the capacitor plates will open and close at every strike. Moreover the harvester structure is durable due to in-built stoppers protecting the moving parts at large accelerations. The thin film between the plates also protects the capacitor plates against wear and short circuits, as well as also in its part the harvester structure from breaking under vibration exceeding the limits of the intended use. The harvester structure is also simple, easy and cost effective to manufacture, because it can be processed with existing methods and tools, such as SOI (Silicon on insulator technology) or MEMS (microelectromechanical systems) technology.

In addition the energy harvester of the invention can be integrated with different kinds of electronic devices. Because the harvester of the invention replaces the conventional batteries and power sources, the harvester also removes the need for changing the batteries and/or loading the power sources. Especially the harvester is ideally for powering wireless applications. In addition the use of e.g. MEMS offers a compact and cost effective solution for manufacturing the harvester component enabling a small scale production at the same time.

BRIEF DESCRIPTION OF THE DRAWINGS

Next the invention will be described in greater detail with reference to exemplary embodiments in accordance with the accompanying drawings, in which.

DETAILED DESCRIPTION

Figure 1A:
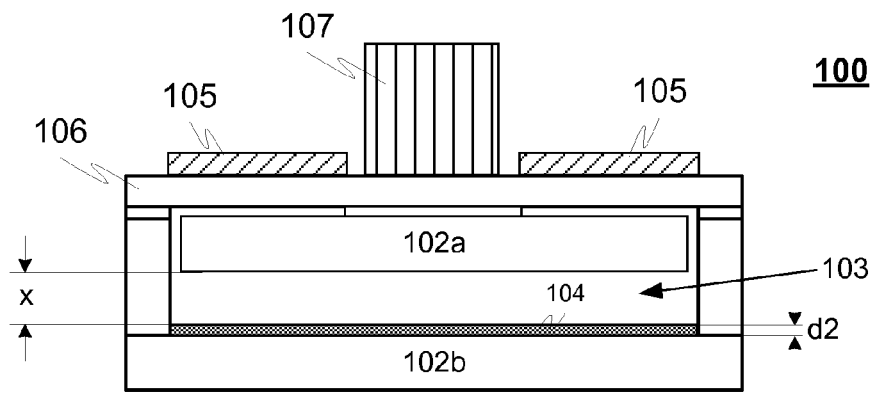
FIGS. 1A-B illustrate an exemplary device for energy harvesting from vibration, strain, turn and/or strike according to an advantageous embodiment of the invention.
Figure 1B:
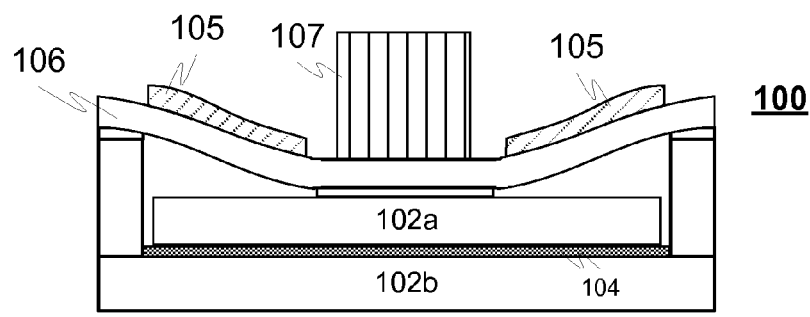

FIGS. 1A-B illustrate an exemplary device 100 for energy harvesting from vibration, strain, turn and/or strike according to an advantageous embodiment of the invention, wherein in FIGS. 1A-B shows also the principle of operation of the device 100, where the device is in an open position and in FIG. 1B in a closed position.

The device 100 advantageously comprises a capacitor harvesting module comprising two capacitor plates 102a, 102b arranged essentially parallel with each other so that at least one of the plates 102a is adapted to move due to vibration, strain, turns and/or strike in an essentially perpendicular direction to the other capacitor plate 102b and thereby forming a variable gap 103 between the plates. Due to the changing distance the capacitance between the plates 102a, 102b is also changed and thereby also electrical power is generated to a power output. For example when the device 100 is utilised in a wheel, the capacitor is closed and opened at every strike or every turn of a wheel and hence it is independent of the harvester mechanical resonance frequency.

The device advantageously comprises also a thin dielectric layer or film 104 arranged between the capacitor plates 102a, 102b to maximize the harvested energy and enable the harvester operation in semi-contact mode, where the plates are separated essentially only by the thin dielectric film, as discussed earlier in this document. The thickness d2 of the dielectric film 104 is advantageously at maximum 25 nm, but may be selected also differently. However it should be noted that thinner the film the closer the plates can move to each other and thus also more powerful energy harvesting can be enabled (as is discussed below).

In addition the device 100 comprises also at least one piezoelectric element 105, which is advantageously as a piezoelectric film. The piezoelectric element is in rest position in FIG. 1A, but when the elastic springy structure 106 bends under vibration and/or stress also the piezoelectric element 105 will bend along with the elastic structure 106 of the device thereby generating a voltage. This voltage is used as a bias voltage and fed to a capacitive harvesting module of the device in order to enable the functioning of the capacitive harvesting, since it needs a bias voltage to be started up. Furthermore the piezoelectric element 105 can be adapted to generate electrical power also to the power output from vibration and/or strain, and not only bias voltage.

At least part of the structure 106 may be formed as an elastic springy element, such as a spring as illustrated in FIGS. 1A-B. Also other kinds of solution can be provided to enable the plates 102a, 102b to oscillate. However, according to the invention at least one of the capacitor plate 102a is related to a springy element 106 so that the spring element enables the plate 102a to oscillate back and forth in relation to the other capacitor plate 102b. The spring constant of the element 106 is advantageously selected so that the gap is minimized and maximized during the vibrations, strains, turns and/or strikes of the device 100.

Furthermore also a mass element 107 may be related to the at least one capacitor plate 102a so that the mass element enables the plate 102a to oscillate more effectively back and forth in relation to the other capacitor plate 102b. The mass is advantageously selected so that the gap is minimized and maximized during the vibrations, strains, turns and/or strikes of the device as much as possible. Generally the mass is selected as great as possible in order to maximize the kinetic energy of the moving plate 102a to which the mass is related and thereby also maximize the harvested energy since the device 100 harvests the electrical energy from the kinetic energy via the changed capacitance.

The capacitance C as a function of the capacitor plate 102a, 102b displacement x of the harvester is (1)

$$C(x) = \frac{\varepsilon_0 A}{d_1 - x + \frac{d_2}{\varepsilon_r}}$$

where $\varepsilon_0$ is the permittivity of vacuum, $\varepsilon_r$ the relative permittivity of the dielectric material 104 and A the area of the capacitor plate 102a, 102b. The energy stored in the variable capacitor is per cycle is (2)

$$E = \frac{1}{2} V_{in}^2 (C_{max} - C_{min}) \left( \frac{C_{max} + C_{par}}{C_{min} - C_{par}} \right)$$

in constant charge mode. Assuming that the parasitic capacitance is negligible and $C_{max} \gg C_{min}$, equation 2 becomes (3)

$$E = \frac{1}{2} V_{in}^2 \frac{C_{max}^2}{C_{min}}$$

It can easily be seen from equation 3 that the harvested energy is maximized when $C_{max}$ is maximized, which occurs when the thickness ($d_2$) of the dielectric layer 104 is as thin as possible. The thickness is limited by manufacturing tolerances and by the electric breakdown of the dielectric material which depends also on the bias voltage used.

The PZC harvester device 100 of the invention will significantly improve the current state-of-the-art. The simulated harvester power is 12 μW at 10 Hz frequency and 100 m/s² acceleration. Generally, the current prior art devices harvesting in 10 μW range are operating either in kHz range (in resonance frequency mode), or are large in size (non-MEMS or MEMS like). MEMS harvesters operating at low frequencies typically harvest in nanowatt range. PZC harvester would significantly increase the current state-of-the-art in low frequency and small size harvester category.

Figure 2:
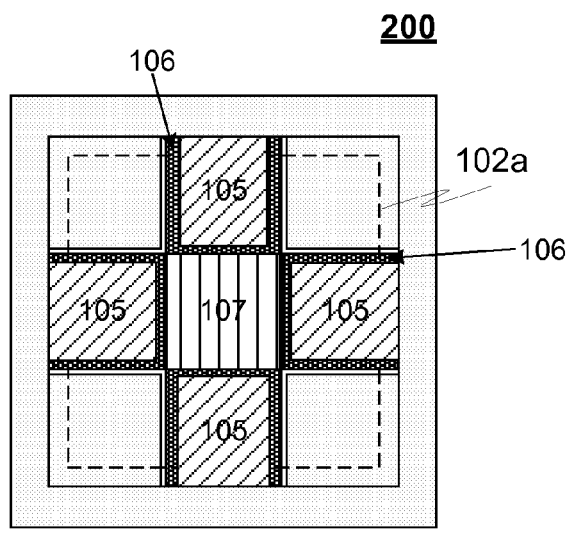
FIG. 2 illustrates an exemplary spring and/or mass configuration in the energy harvesting device according to an advantageous embodiment of the invention.

FIG. 2 illustrates a top view of an exemplary spring and/or mass configuration 200 in the energy harvesting device 100 according to an advantageous embodiment of the invention. The mass 107 is advantageously arranged in the center area where it can enable maximum back and forth motion for the moving capacitor plate. The spring element structure 106 may be for example as illustrated in FIG. 2, where the spring element is fixed with the housing of the device in its edge portions so that the spring structure enables maximum back and forth motion for the center area and thus also for the moving capacitor plate.

According to an embodiment the piezoelectric element 105 may be fixed on the spring element 106 so that the piezoelectric element 105 bends along with the back and forth bending spring element 106 under vibration and/or stress and thereby generates voltage as discussed above in this document.

The capacitor plates are advantageously electrically insulated from the housing of the device, as well as the environment, for example.

Figure 3:
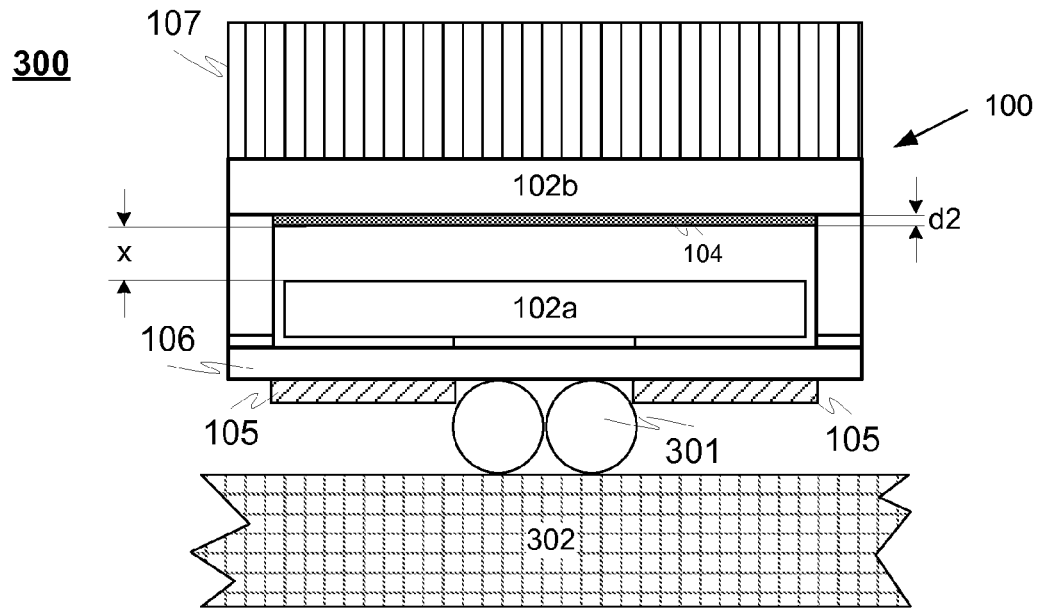
FIG. 3 illustrates an exemplary flip-chip mounting of the energy harvesting device according to an advantageous embodiment of the invention.

FIG. 3 illustrates an exemplary flip-chip mounting 300 of the energy harvesting device 100 according to an advantageous embodiment of the invention, where the device is mounted upside down in order to be flip-chipped and provide more proof mass. This position makes it also easier to glue an extra mass to the chip, such as mass 107 on the top of the device. The device 100 may be mounted for example via mounting elements 301 in the oscillating or vibrating structure 302, as discussed elsewhere in this document.

The numbering of the parts and features of the device 100 in FIG. 3 corresponds with the numbering of the same parts illustrated in connection with other figures in this document.

Figure 4:
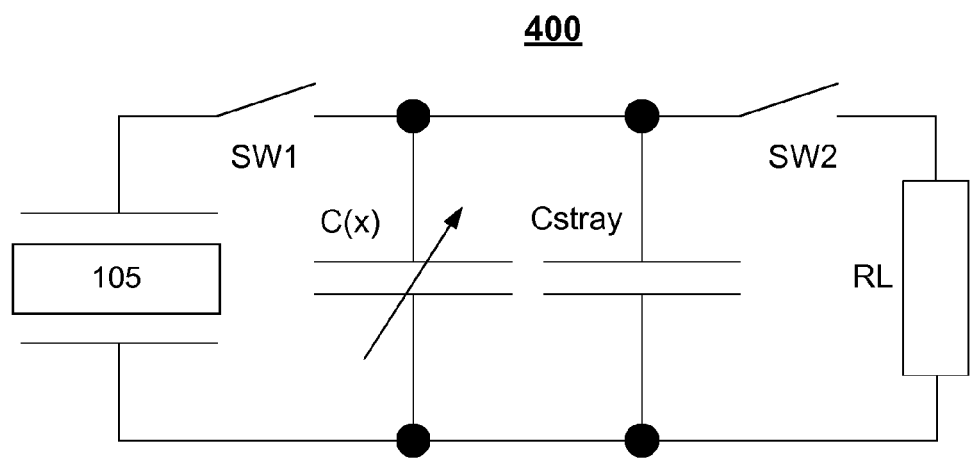
FIG. 4 illustrates an exemplary switching diagram of the energy harvesting device according to an advantageous embodiment of the invention.

FIG. 4 illustrates an exemplary switching diagram 400 of the energy harvesting device 100 according to an advantageous embodiment of the invention, where C(x) represents the changing capacitance due to the moving capacitor plates of the device according to the invention. The harvester device 100 is adapted to generate electrical power advantageously from the changing capacitance for example to the electronic equipments $R_L$ connected with the power output of the device 100. The capacitive module comprising the capacitor plates is advantageously connected with the power output via switch a SW2.

In addition the piezoelectric element 105, adapted to generate a bias voltage, is connected to the capacitor module of the device 100 in order to enable the functioning of the capacitive harvesting, since the capacitive module needs the bias voltage to be started up. The piezoelectric element module 105 is advantageously connected with the capacitor module via a switch SW1.

In addition to the bias voltage the piezoelectric element 105 can be adapted to generate electrical power also to the electronic equipments $R_L$, whereupon the piezoelectric element 105 is also advantageously connected to the power output via switch a SW2.

The invention has been explained above with reference to the aforementioned embodiments, and several advantages of the invention have been demonstrated. It is clear that the invention is not only restricted to these embodiments, but comprises all possible embodiments within the spirit and scope of the inventive thought and the following patent claims.

The invention claimed is:

1. A device for energy harvesting from vibration, strain, turn and/or strike, comprising:
   a capacitor harvesting module comprising two capacitor plates arranged essentially parallel with each other so that at least one of the plates is adapted to move due to vibration, strain, turns and/or strike in an essentially perpendicular direction to the other capacitor plate and thereby forming a variable gap between the plates and changing the capacitance between the plates and to generate electrical power to a power output;
   a thin dielectric film arranged between the capacitor plates; and
   a piezoelectric element adapted to generate a bias voltage to the capacitor harvesting module from vibration and/or strain,
   wherein at least one of the capacitor plates is related to a spring element so that the spring element enables said plate to oscillate back and forth in relation to said other capacitor plate, a spring constant of which is advantageously selected so that the gap is minimized and maximized during the vibrations, strains, turns and/or strikes of the device.

2. The device according to claim 1, wherein the thickness of the dielectric film is at maximum 25 nm.

3. The device according to claim 2, wherein said piezoelectric element is adapted to generate electrical power to the power output from vibration and/or strain.

4. The device according to claim 1, wherein said piezoelectric element is adapted to generate electrical power to the power output from the vibration and/or strain.

5. The device according to claim 1, wherein the gap between the plates is adapted to be minimized and maximized continuously during the vibrations, strains, turns and/or strikes of the device.

6. The device according to claim 1, wherein a mass element is related to the at least one capacitor plate so that the mass element enables said plate to oscillate back and forth in relation to said other capacitor plate, the mass being advantageously selected so that the gap is minimized and maximized during the vibrations, strains, turns and/or strikes of the device.

7. A system, comprising the device of claim 1.

8. The system according to claim 7, wherein the system is an oscillating, vibrating, reciprocating, turning and/or striking system, a wheel, a tire, and pipelines or other equipments in a processing industry.

9. A method for manufacturing a device (100) according to claim 1, wherein the method comprises:
   Arranging the two capacitor plates essentially parallel with each other into a capacitor harvesting module so that at least one of the plates moves due to vibration, strain, turns and/or strike in an essentially perpendicular direction to the other capacitor plate thereby forming a variable gap between the plates and changing the capacitance between the plates and generating electrical power to a power output;
   arranging the thin dielectric film between the capacitor plates; and
   arranging the piezoelectric element to generate a bias voltage to the capacitor harvesting module from vibration and/or strain.

10. The method according to claim 9, wherein the method additionally comprises connecting the spring and/or a mass element to at least one of the capacitor plates so that the spring and/or mass element enables said plate to oscillate back and forth in relation to said other capacitor plate, and wherein the spring constant and/or mass is advantageously selected so that the gap is minimized and maximized during the vibrations, strains, turns and/or strikes of the device.

11. A device for energy harvesting from vibration, strain, turn and/or strike, comprising:
   a capacitor harvesting module comprising two capacitor plates arranged essentially parallel with each other so that at least one of the plates is adapted to move due to vibration, strain, turns and/or strike in an essentially perpendicular direction to the other capacitor plate and thereby forming a variable gap between the plates and changing the capacitance between the plates and to generate electrical power to a power output;
   a thin dielectric film arranged between the capacitor plates; and
   a piezoelectric element adapted to generate a bias voltage to the capacitor harvesting module from vibration and/or strain,
   wherein the capacitor plates are adapted to move in relation with each other into a semi-contact mode, where the plates are separated essentially only by the thin dielectric film.

12. A method for harvesting energy from vibration, strain, turn and/or strike, comprising:
   arranging at least one capacitor plate of two capacitor plates essentially parallel with each other in a capacitor harvesting module that is moved by vibration, strain, turn and/or strike in an essentially perpendicular direction to the other capacitor plate and thereby forming a variable gap between the plates and changing the capacitance between the plates and generating electrical power to a power output;
   using a thin dielectric film is used between the capacitor plates; and
   a piezoelectric element generating a bias voltage to the capacitor harvesting module from vibration and/or strain,
   wherein the gap between the plates is minimized and maximized continuously during the vibration, strains, turns and/or strikes of the device.

13. The method according to claim 12, wherein also said piezoelectric element generates electrical power to the power output from the vibration and/or strain.

14. The method according to claim 12, wherein a spring element is connected with at least one of the capacitor plate so that the spring element enables said plate to oscillate back and forth in relation to said other capacitor plate, and where the spring constant of the spring element is advantageously selected so that the gap is minimized and maximized during the vibrations, strains, turns and/or strikes of the device.

15. The method according to claim 12, wherein a mass element is related to the at least one capacitor plate so that the mass element enables said plate to oscillate back and forth in relation to said other capacitor plate, and wherein the mass is advantageously selected so that the gap is minimized and maximized during the vibrations, strains, turns and/or strikes of the device.

16. The method according to claim 12, wherein the capacitor plates are moved in relation with each other into a semi-contact mode, where the plates are separated essentially only by the thin dielectric film.

17. A method according to claim 13, wherein the gap between the plates is minimized and maximized continuously during the vibration, strains, turns and/or strikes of the device.

\* \* \* \* \*